United States Patent
Choi

(10) Patent No.: US 10,593,878 B2
(45) Date of Patent: Mar. 17, 2020

(54) ELECTRONIC DEVICE AND METHOD FOR FABRICATING THE SAME

(71) Applicant: SK hynix Inc., Icheon (KR)

(72) Inventor: Kyoung Su Choi, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/107,338

(22) Filed: Aug. 21, 2018

(65) Prior Publication Data
US 2019/0181341 A1    Jun. 13, 2019

(30) Foreign Application Priority Data
Dec. 11, 2017  (KR) .......................... 10-2017-0169415

(51) Int. Cl.
| | | |
|---|---|---|
| *H01L 21/00* | (2006.01) | |
| *H01L 21/16* | (2006.01) | |
| *H01L 45/00* | (2006.01) | |
| *G11C 7/18* | (2006.01) | |
| *G11C 8/14* | (2006.01) | |
| *H01L 27/24* | (2006.01) | |
| *H01L 27/22* | (2006.01) | |

(52) U.S. Cl.
CPC .......... *H01L 45/1675* (2013.01); *G11C 7/18* (2013.01); *G11C 8/14* (2013.01); *H01L 27/2409* (2013.01); *H01L 27/2463* (2013.01); *H01L 45/1233* (2013.01); *H01L 45/1253* (2013.01); *H01L 45/144* (2013.01); *H01L 45/146* (2013.01); *H01L 45/147* (2013.01); *H01L 45/1683* (2013.01); *G11C 2213/71* (2013.01); *H01L 27/22* (2013.01); *H01L 27/224* (2013.01); *H01L 45/06* (2013.01)

(58) Field of Classification Search
CPC ............ H01L 27/2463; H01L 45/1675; H01L 45/1233; H01L 45/1253; G11C 7/18; G11C 8/14
USPC ........................................................ 438/104
See application file for complete search history.

(56) References Cited

U.S. PATENT DOCUMENTS 9,620,633 B2 * 4/2017 Huang ................. H01L 29/7851
2019/0198668 A1 * 6/2019 Tang ..................... H01L 29/7827

FOREIGN PATENT DOCUMENTS

KR    10-2015-0090472 A    8/2015

* cited by examiner

*Primary Examiner* — David S Blum

(57) ABSTRACT

An electronic device includes a semiconductor memory, wherein the semiconductor memory comprises a plurality of memory stacks neighboring each other in a first direction and a second direction, the second direction intersecting the first direction, a plurality of first liner layers covering sidewalls of memory stacks that neighbor each other in the second direction, the plurality of first liner layers extending in the second direction, a plurality of first air gaps located in spaces covered by the first liner layers, and a plurality of second air gaps located between each pair of memory stacks that neighbor each other in the first direction, the plurality of second air gaps extending in the second direction.

18 Claims, 10 Drawing Sheets

II – II'

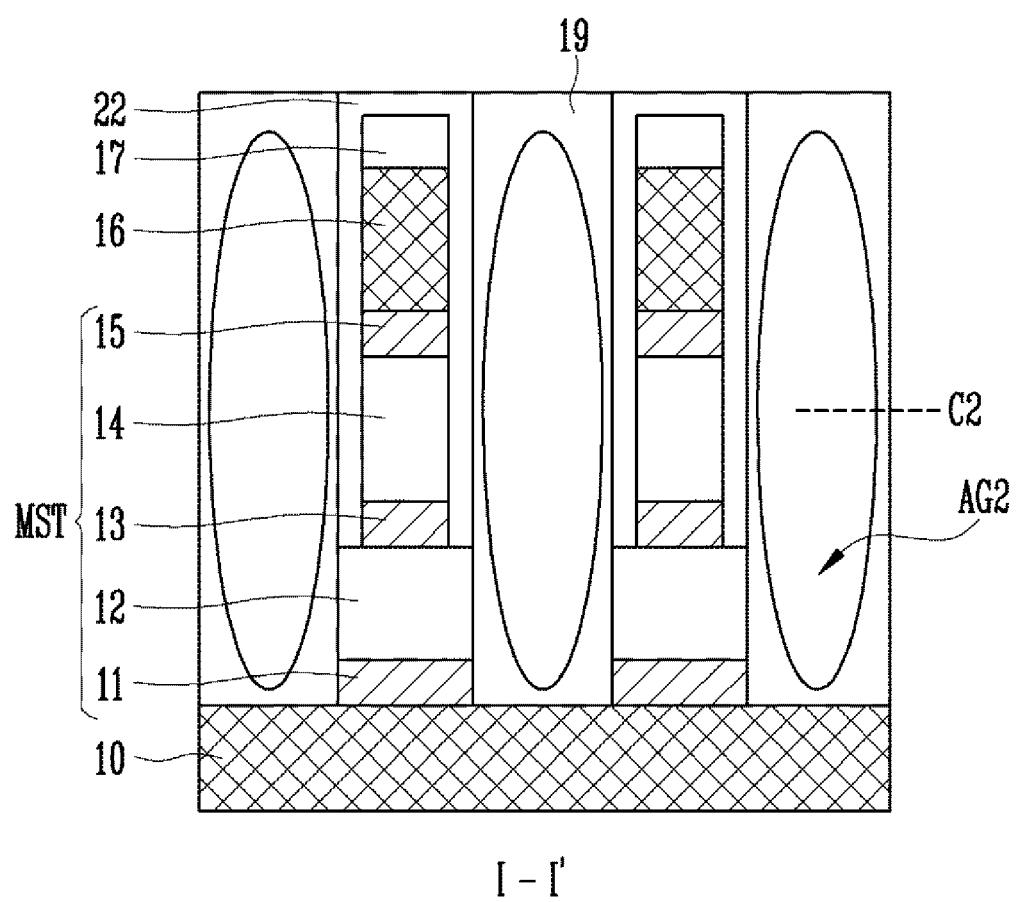

ELECTRONIC DEVICE AND METHOD FOR FABRICATING THE SAME

CROSS-REFERENCE TO RELATED APPLICATION

The present application claims priority under 35 U.S.C. § 119(a) to Korean patent application number 10-2017-0169415, filed on Dec. 11, 2017, which is incorporated herein by reference in its entirety.

BACKGROUND

Field of Invention

Various embodiments of the present disclosure relate to a memory circuit or a memory device, and an application thereof in an electronic device.

Description of Related Art

Recently, as electronic devices trend toward miniaturization, low power consumption, high performance, diversification, and so on, semiconductor devices capable of storing information in various electronic devices, such as computers and portable communication devices, have been in demand. Thus, research has been conducted for developing semiconductor devices having switching characteristics, i.e., devices capable of storing data by switching between different resistance states according to an applied voltage or current. Examples of semiconductor devices with switching characteristics include a Resistive Random Access Memory (RRAM), a Phase-change Random Access Memory (PRAM), a Ferroelectric Random Access Memory (FRAM), a Magnetic Random Access Memory (MRAM), an E-fuse, and the like.

SUMMARY

Various embodiments of the present disclosure are directed to an electronic device including a memory cell with improved operation characteristics and reliability, and a method for fabricating the same.

According to an embodiment, an electronic device may include a semiconductor memory, wherein the semiconductor memory comprises a plurality of memory stacks neighboring each other in a first direction and a second direction, the second direction intersecting the first direction, a plurality of first liner layers covering sidewalls of memory stacks that neighbor each other in the second direction, the plurality of first liner layers extending in the second direction, a plurality of first air gaps located in spaces covered by the first liner layers, and a plurality of second air gaps located between each pair of memory stacks that neighbor each other in the first direction, the plurality of second air gaps extending in the second direction.

According to another embodiment, an electronic device may include a semiconductor memory, wherein the semiconductor memory comprises a plurality of row lines extending in a first direction, a plurality of column lines extending in a second direction that intersects the first direction, a plurality of memory cells respectively located at intersections of the row lines and the column lines, an insulating layer located between the row lines and the column lines, the insulating layer covering sidewalls of the memory cells, a plurality of first air gaps located in the insulating layer and between each pair of the memory cells neighboring each other in the second direction, each of the first air gaps having an isolated island shape, and a plurality of second air gaps located in the insulating layer and between each pair of the memory cells neighboring each other in the first direction, each of the second air gaps having a linear shape extending in the second direction.

According to another embodiment, a method of fabricating an electronic device including a semiconductor memory may include forming a stacked structure, forming a plurality of first trenches that pass through the stacked structure and that extend in a first direction, forming a plurality of first liner layers on inner walls of the first trenches, forming a plurality of sacrificial patterns in the first trenches, forming a plurality of second trenches that partially pass through the stacked structure and that extend in a second direction intersecting the first direction, forming a plurality of second liner layers on inner walls of the second trenches, the second liner layers partially covering the sacrificial patterns, forming memory stacks neighboring each other in the first direction and the second direction by extending the second trenches downwards, and forming first air gaps in spaces covered by the second liner layers by removing the sacrificial patterns covered by the second liner layers through the second trenches.

BRIEF DESCRIPTION OF THE DRAWINGS

FIGS. 2A to 2C are views illustrating a structure of an electronic device according to an embodiment of the present disclosure;

DETAILED DESCRIPTION

Figure 1A:
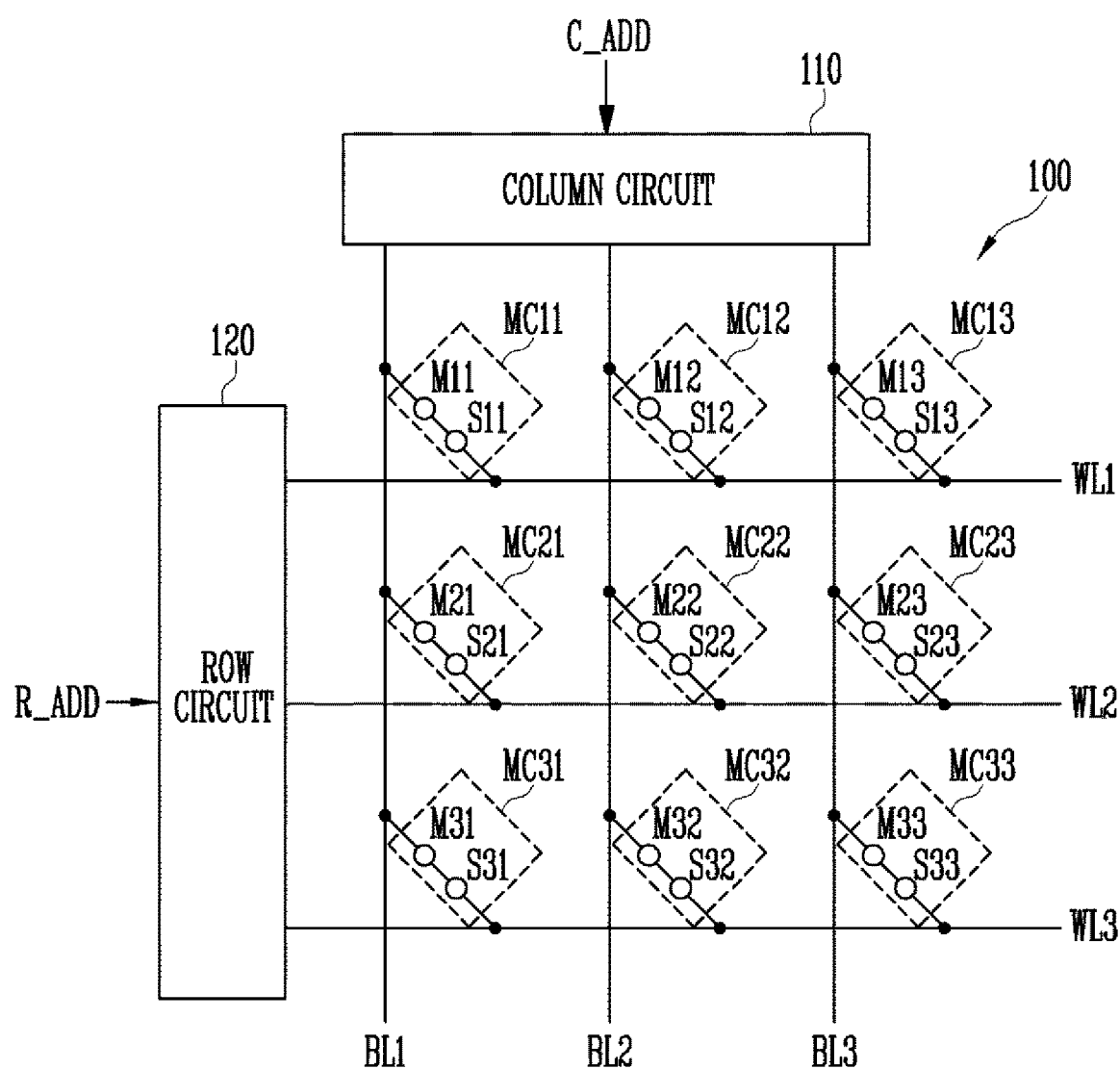
FIGS. 1A and 1B are diagrams illustrating a structure of an electronic device according to an embodiment of the present disclosure.

Hereinafter, various exemplary embodiments will be described in detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of various embodiments of the present disclosure to those skilled in the art. Throughout the disclosure, like reference numerals refer to like parts throughout the various figures and embodiments of the present disclosure.

The drawings are not necessarily to scale and, in some instances, proportions may have been exaggerated in order to clearly illustrate features of the embodiments. It will be understood that when an element is referred to as being "between" two elements, it can be the only element between the two elements, or one or more intervening elements may also be present. When a first layer is referred to as being "on" a second layer or "on" a substrate, it not only refers to a case where the first layer is formed directly on the second layer or the substrate but also a case where a third layer exists between the first layer and the second layer or the substrate. Like reference numerals refer to like elements throughout the disclosure.

Figure 1B:
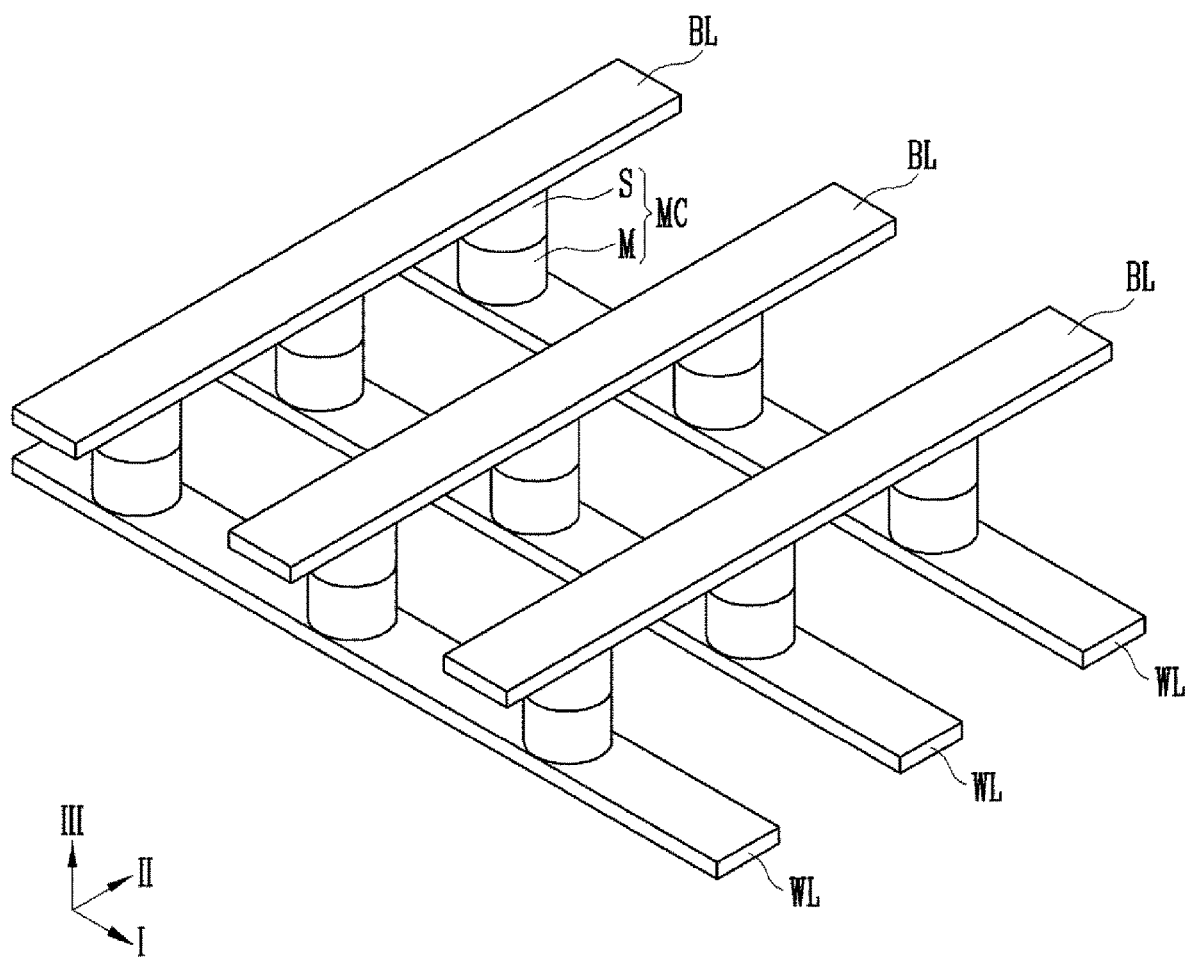

FIGS. 1A and 1B are diagrams illustrating a structure of an electronic device according to an embodiment of the present disclosure. FIG. 1A is a circuit diagram of a memory cell array 100, and FIG. 1B is a perspective view of a memory cell array corresponding to the memory cell array 100 of FIG. 1.

Referring to FIG. 1A, the electronic device according to an embodiment of the present disclosure may include a semiconductor memory, and the semiconductor memory may include row lines and column lines intersecting the row lines. The row lines may be word lines and the column lines may be bit lines. The word lines and the bit lines may be defined relative to each other. For example, in an alternative embodiment, the row lines may be the bit lines and the column lines may be the word lines. In a specific example described below, row lines are word lines WL1 to WL3 and column lines are bit lines BL1 to BL3.

The semiconductor memory may include memory cells MC11 to MC33 respectively disposed between the column lines BL1 to BL3 and the row lines WL1 to WL3. The memory cells MC11 to MC33 may be disposed at intersections of the column lines BL1 to BL3 and the row lines WL1 to WL3. The respective memory cells MC11 to MC33 may include selection elements S11 to S33 and memory elements M11 to M33. The selection elements S11 to S33 and the memory elements M11 to M33 are coupled to each other in series, respectively. The selection elements S11 to S33 may be electrically connected to the row lines WL1 to WL3, respectively, and the memory elements M11 to M33 may be electrically connected to the column lines BL1 to BL3, respectively.

The memory elements M11 to M33 may be configured to store data, and may each include a variable resistance material. The memory elements M11 to M33 may each include, for example, a resistance-change layer, a magnetic tunnel junction layer, a phase-change layer, or a combination thereof.

The selection elements S11 to S33 may be configured to select the memory cells MC11 to MC33, respectively, and may each include a switching material. The selection elements S11 to S33 may each include, for example, a Metal Insulator Transition (MIT) element, a Mixed Ion-Electron Conducting (MIEC) element, an Ovonic Threshold Switching (OTS) element, or a combination thereof. Shapes and configurations of the respective memory cells MC11 to MC33 may be variously changed according to various embodiments of the present disclosure. For example, the selection elements S11 to S33 may be omitted. In another example, positions of the selection elements S11 to S33 may be switched with positions of the memory elements M11 to M33.

In addition, the semiconductor memory may further include a column circuit 110 to control the column lines BL1 to BL3 and a row circuit 120 to control the row lines WL1 to WL3.

The row circuit 120 may be a row decoder, a word line decoder, a word line driver, or a combination thereof. The row circuit 120 may select one of the row lines WL1 to WL3 based on a row address R_ADD. For example, the row circuit 120 may receive the row address R_ADD, and may select the row line WL2 among the row lines WL1 to WL3 based on the row address R_ADD.

The column circuit 110 may be a column decoder, a bit line decoder, a bit line driver, or a combination thereof. The column circuit 110 may select one of the column lines BL1 to BL3 based on a column address C_ADD. For example, the column circuit 110 may receive the column address C_ADD, and may select the column line BL2 among the column lines BL1 to BL3 based on the column address C_ADD.

One of the memory cells MC11 to MC33 is selected based on the selected one of the row line WL1 to WL3 and the selected one of the column lines BL1 to BL3. For example, when the row circuit 120 selects the row line WL2 and the column circuit 110 selects the column line BL2, the memory cell MC22 coupled between the selected column line BL2 and the selected row line WL2 is selected.

Although three column lines BL1 to BL3 and three row lines WL1 to WL3 are illustrated in FIG. 1A for convenience of explanation, the present disclosure may not be limited thereto. The numbers of column lines and row lines included in the memory cell array 100 may be changed according to various embodiments of the present disclosure.

Referring to FIG. 1B, the memory cell array may include column lines BL and row lines WL, which are located at different levels. For example, the column lines BL may be located above the row lines WL. In addition, the row lines WL may extend in parallel with each other in a first direction I, and the column lines BL may extend in parallel with each other in a second direction II intersecting the first direction I.

The memory cells MC may be disposed at intersections of the column lines BL and the row lines WL, and may be arranged in a matrix format. In addition, each of the memory cells MC may include a memory stack including multiple layers that are stacked on each other. For example, each of the memory cells MC may include a memory element M and a selection element S, which are stacked on each other.

Although an example of the memory cell array having a single-deck structure is illustrated in FIG. 1B, in various embodiments, the memory cells MC may be stacked in a third direction III that is perpendicular to the first and second direction I and II. For example, the memory cell array may have a multi-deck structure where the row lines WL and the column lines BL are alternately stacked in the third direction III.

Although not illustrated in FIG. 1B, insulating materials may fill spaces between neighboring memory cells MC, spaces between neighboring row lines WL, and spaces between neighboring column lines BL. In addition, air gaps may be located in the insulating materials. For example, the air gaps may be located between neighboring memory cells MC.

Figure 2A:
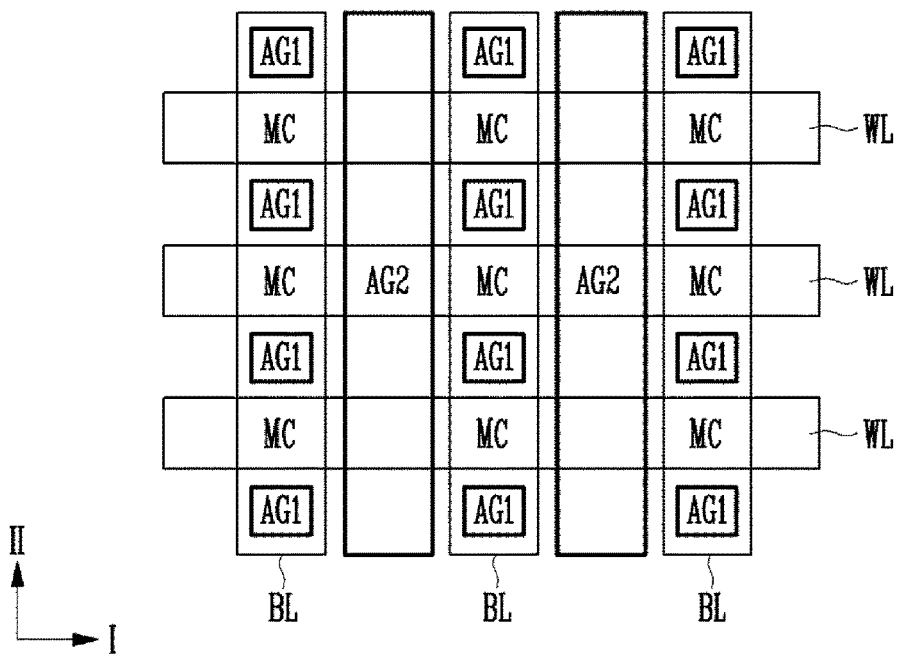
Figure 2B:
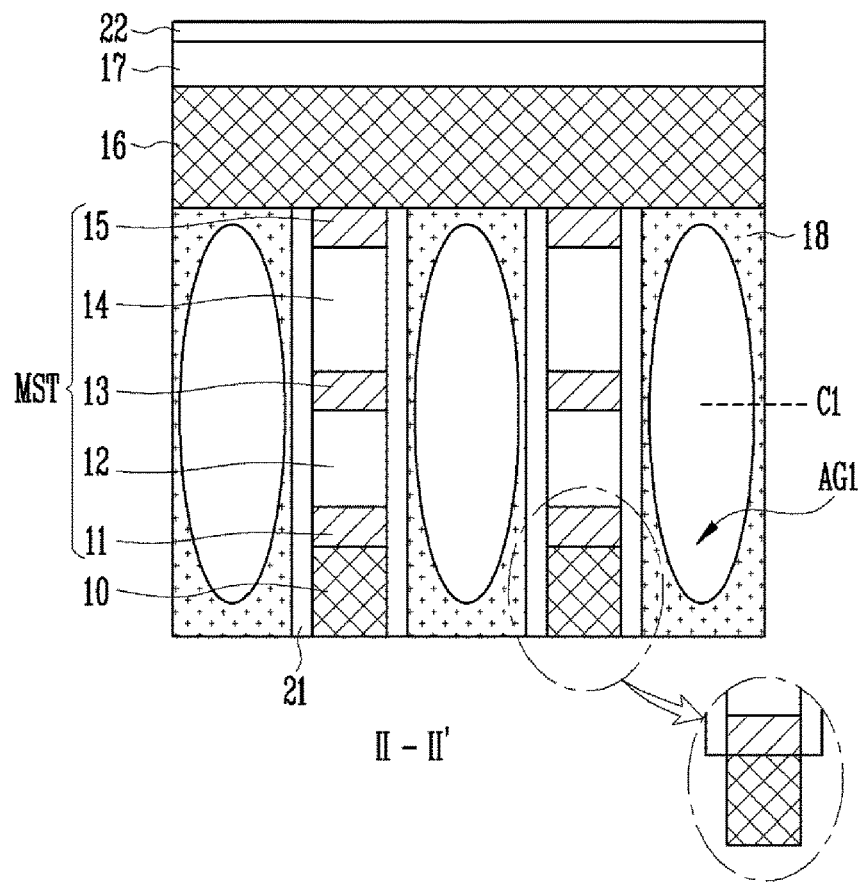

FIGS. 2A to 2C are views illustrating a structure of an electronic device according to an embodiment of the present disclosure. FIG. 2A is a layout view, and illustrates a first direction I and a second direction II. FIG. 2B is a cross-sectional view taken along the second direction II (i.e., along II-II') of FIG. 2A, and FIG. 2C is a cross-sectional view taken along the first direction I (i.e., along I-I') of FIG. 2A.

Referring to FIG. 2A, first and second air gaps AG1 and AG2 may be located between neighboring memory cells MC. The first air gaps AG1 may be located between each pair of the memory cells MC neighboring each other in the second direction II. Each of the first air gaps AG1 may have an isolated island shape. The second air gaps AG2 may be located between each pair of the memory cells MC neighboring each other in the first direction I. Each of the second air gaps AG2 may have a linear shape extending in the second direction II. Accordingly, the second air gaps AG2 may be located between each pair of the first air gaps AG1 neighboring in the first direction I, as well as between each pair of the memory cells MC neighboring each other in the first direction I.

The memory cells MC, as illustrated in FIG. 2A, may be located between row lines 10 and between column lines 16, as illustrated in FIGS. 2B and 2C. Each of the memory cells MC, as illustrated in FIG. 2A, may include a memory stack MST, as illustrated in FIGS. 2B and 2C. Referring to FIGS. 2B and 2C, liner layers 21 and 22 may cover sidewalls of the memory stacks MST. Insulating patterns 18 and 19 may fill spaces between the memory stacks MST.

Each of the memory stacks MST may include a lower electrode 11, a switching material 12, an intermediate electrode 13, a variable resistance material 14, and an upper electrode 15, which are sequentially stacked on each other.

The variable resistance material 14 reversibly switches between different resistance states according to a voltage or a current applied to the variable resistance material 14. Therefore, data of '1' may be stored when the variable resistance material 14 has a low resistance state and data of '0' may be stored when the variable resistance material 14 has a high resistance state. The variable resistance material 14 may be a resistance-change layer, a magnetic tunnel junction layer, a phase-change layer, or a combination thereof. For example, the variable resistance material 14 may be a resistance-change layer, and may include a transition metal oxide, a metal oxide, such as a perovskite-based material, or a combination thereof. In another example, the variable resistance material 14 may include a single magnetic tunnel junction layer or a double magnetic tunnel junction layer. In another example, the variable resistance material 14 may be a phase-change layer, and may include a chalcogenide-based material. The chalcogenide-based material may be Ge—Sb—Te (GST), such as $Ge_2Sb_2Te_5$, $Ge_2Sb_2Te_7$, $Ge_1Sb_2Te_4$, or $Ge_1Sb_4Te_7$. In various embodiments, the variable resistance material 14 may have a single-layer structure or a multi-layer structure.

The switching material 12 may be a selection element, which controls a flow of a current according to a level of a voltage or a current applied to the switching material 12. For example, the switching material 12 may substantially block a current through the switching material 12 when the level of the applied voltage or current is smaller than or equal to a predetermined critical value, and may pass the current through the switching material 12 when the level of the applied voltage or current exceeds the predetermined critical value. When the applied voltage or current exceeds the predetermined critical value, the current through the switching material 12 may be substantially proportional to the applied voltage or current.

In an example, the switching material 12 may include $NbO_2$, $TiO_2$, a Metal Insulator Transition (MIT) element, or a combination thereof. In another example, the switching material 12 may include $ZrO_2(Y_2O_3)$, $Bi_2O_3$—BaO, or $(La_2O_3)x(CeO_2)_{1-x}$; a Mixed Ion-Electron Conducting (MIEC) element; or a combination thereof. In another example, the switching material 12 may include a chalcogenide-based material, such as $As_2Te_3$, $As_2$, or $As_2Se_3$; an Ovonic Threshold Switching (OTS) element; or a combination thereof. In addition, the switching material 12 may have a single-layer structure or a multi-layer structure.

The lower electrode 11 may be electrically connected to a row line 10, which corresponds to the row line WL of FIG. 2A. The intermediate electrode 13 may be interposed between the switching material 12 and the variable resistance material 14. The upper electrode 15 may be electrically connected to a column line 16, which corresponds to the column line BL of FIG. 2A. Each of the lower electrode 11, the intermediate electrode 13, and the upper electrode 15 may include a metal, a metal nitride, carbon, or a combination thereof, and may have a single-layer structure or a multi-layer structure.

A width of an upper portion of each of the memory stacks MST may be equal to or different from a width of a lower portion of each of the memory stacks MST. For example, each of the memory stacks MST may have a width that increases from the upper portion toward the lower portion of each of the memory stacks MST. More specifically, the lower electrode 11 and the switching material 12 may have greater widths than the intermediate electrode 13, the variable resistance material 14, and the upper electrode 15. In addition, the sidewalls of the memory stacks MST may have a step shape. In addition, the shape and configuration of the memory stack MST may be variously changed. For example, at least one among the lower electrode 11, the intermediate electrode 13, and the upper electrode 15 may be omitted. Alternatively, at least one layer (not illustrated) may be additionally formed at interfaces between the layers 11 to 15 included in the memory stack MST, in order to improve characteristics or processes of the memory cell MC.

Referring to FIG. 2B, the first liner layers 21 may be formed on sidewalls of the memory stacks MST that face each other in the second direction II. That is, the memory stacks MST that neighbor each other in the first direction I may be covered by the first liner layers 21 and the sidewalls of the memory stacks MST that face each other in the second direction II may be covered by the first liner layers 21. The first liner layers 21 may entirely or partially cover the sidewalls of the memory stacks MST. Each of the first liner layers 21 may have different thicknesses. For example, each of the first liner layers 21 may have a thickness that increases from a lower portion toward an upper portion thereof. Each of the first liner layers may include a single layer in some regions, and multiple layers in other regions. In addition, the first liner layers 21 may extend to sidewalls of the row lines 10. According to various embodiments, the first liner layers 21 may entirely or partially cover the sidewalls of the row lines 10, or may entirely expose the sidewalls of the row lines 10.

The first liner layers 21 may protect the memory stacks MST during fabricating processes. The first liner layers may include a nonconductive material, such as a nitride, polysilicon, or a combination thereof. For example, the first liner layers 21 may include a silicon nitride ($SiN_x$), polysilicon, titanium nitride (TiN), tantalum nitride (TaN), or a combination thereof. In addition, each of the first liner layers 21 may include a single layer or multiple layers.

The first insulating patterns 18 may be located between each pair of the memory stacks MST neighboring each other in the second direction II. The first insulating patterns 18 may be residual sacrificial layers, which are formed when sacrificial layers are removed to form the first air gaps AG1. However, the first insulating patterns 18 may not exist when the sacrificial layers are completely removed. Therefore, the first insulating patterns 18 may include a material having high etch selectivity to the first liner layers 21, and may include an oxide. For example, the first insulating patterns 18 may include a silicon oxide ($SiO_x$), a Spin On Coating (SOC) material, or a combination thereof.

The first air gaps AG1 may be spaces located between each pair of the memory stacks MST neighboring each other in the second direction II. The first air gaps AG1 may entirely or partially fill the spaces between each pair of the memory stacks MST neighboring each other in the second direction II. In an embodiment, the first insulating patterns 18 may include the first air gaps AG1, respectively. At least a portion of the first liner layers 21 may be exposed in the first air gaps AG1.

Each of the first air gaps AG1 may extend in a direction parallel to a stacking direction of the memory stack MST. Each of the first air gaps AG1 may overlap at least one among the row line 10, the lower electrode 11, the switching material 12, the intermediate electrode 13, the variable resistance material 14, and the upper electrode 15, in a direction perpendicular to the stacking direction. In addition, each of the first air gaps AG1 may have an elliptical cross section, in which a width of the elliptical cross section decreases from a center of the cross section toward top and bottom portions of the cross section. The cross section may be parallel to the second direction II (i.e., II-II').

Referring to FIGS. 2A and 2C, the second liner layers 22 may extend in the second direction II, and may also cover sidewalls of the memory stacks MST facing each other in the first direction I. In an embodiment, the second liner layers 22 may continuously cover sidewalls of each pair of the memory stacks MST neighboring each other in the second direction II, and may fill spaces between each pair of the memory stacks MST neighboring each other in the second direction II. The second liner layers 22 may also cover the first insulating patterns 18 and the first air gaps AG1, which are located between the memory stacks MST neighboring each other in the second direction II. Therefore, the isolated first air gaps AG1, which are located between the memory stacks MST neighboring each other in the second direction II, may be defined by the second liner layers 22.

The second liner layers 22 may entirely or partially cover the sidewalls of the memory stacks MST. For example, each of the second liner layers 22 may cover sidewalls of the intermediate electrode 13, the variable resistance material 14, and the upper electrode 15, and may expose sidewalls of the lower electrode 11 and the switching material 12. In addition, the second liner layers 22 may upwardly extend to cover sidewalls of structures, which are located above the memory stacks MST. For example, each of the second liner layers 22 may cover sidewalls of the column line 16 and a hard mask pattern 17, which is located above the column line 16.

The second liner layers 22 may protect the memory stacks MST during fabricating processes, and may include a non-conductive material, such as a nitride, polysilicon, or a combination thereof. For example, the second liner layers 22 may include a silicon nitride (SiNx), polysilicon, a titanium nitride (TiN), a tantalum nitride (TaN), or a combination thereof. In addition, the second liner layers 22 may include a single layer or multiple layers.

The second insulating patterns 19 may be located between each pair of the memory stacks MST neighboring each other in the first direction I. The second insulating patterns 19 may each have a linear shape extending in the second direction II. In addition, the second insulating patterns 19 may include the second air gaps AG2, respectively. Accordingly, the second air gaps AG2 may also each have a linear shape extending in the second direction II.

The second insulating patterns 19 may be formed of a material having high etch selectivity to the second liner layers 22, and may include an oxide. For example, the second insulating patterns 19 may include a silicon oxide ($SiO_x$), a Spin On Coating (SOC) material, or a combination thereof.

The second air gaps AG2 may be spaces located between each pair of the memory stacks MST neighboring each other in the first direction I. The second air gaps AG2 may entirely or partially fill the spaces between each pair of the memory stacks MST neighboring each other in the first direction I. Therefore, the second insulating patterns 19 may include the second air gaps AG2, respectively, and at least a portion of the second liner layers 22 may be exposed in the second air gaps AG2.

Each of the second air gaps AG2 may extend in a direction parallel to the stacking direction of the memory stack MST, and may overlap at least one among the lower electrode 11, the switching material 12, the intermediate electrode 13, the variable resistance material 14, the upper electrode 15, the column line 16, and the hard mask pattern 17.

Each of the second air gaps AG2 may have an elliptical cross section, in which a width of the elliptical cross section decreases from a center portion toward top and bottom portions of the cross section. The cross section may be parallel to the first direction I (i.e., I-I'). In addition, the first air gaps AG1 and the second air gaps AG2 may be located at the same level or at different levels. For example, a center C2 of each of the second air gaps AG2 may be located higher than a center C1 of each of the first air gaps AG1. In this example, the center C1 of each of the first air gaps AG1 may be at substantially the same vertical level as the switching material 12, and the center C2 of each of the second air gaps AG2 may be at substantially the same vertical level as the variable resistance material 14.

According to the above-described structure, sidewalls of the memory cells MC may be surrounded by an insulating layer, which includes the first and second liner layers 21 and 22 and the first and second insulating patterns 18 and 19. The first air gaps AG1, which have isolated island shapes, and the second air gaps AG2, which have linear shapes, may be located in the insulating layer. Therefore, not only may interference among the pairs of memory cells MC neighboring each other in the first direction I be prevented, but also interference among the pairs of memory cells MC neighboring in each other in the second direction II may be prevented. Accordingly, reliability of a memory cell operation may be improved.

FIGS. 3A to 3E are perspective views illustrating a method for fabricating an electronic device according to an embodiment of the present disclosure. Hereinafter, any repetitive detailed description of components already mentioned above will be omitted.

Figure 3A:
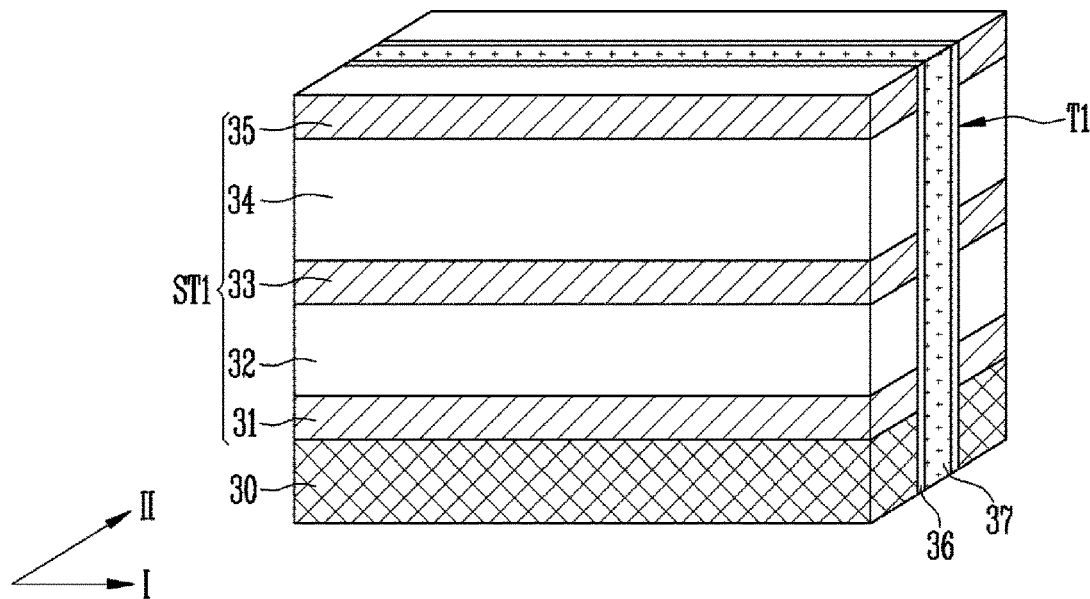
FIGS. 3A to 3E are perspective views illustrating a method for fabricating an electronic device according to an embodiment of the present disclosure.

Referring to FIG. 3A, a first stacked structure ST1 may be formed over a row line conductive layer 30. For example, the first stacked structure ST1 may be formed by sequentially forming a lower electrode layer 31, a switching material layer 32, an intermediate electrode layer 33, a variable resistance material layer 34, and an upper electrode layer 35. The row line conductive layer 30 may include a metal, such as tungsten (W).

Subsequently, first trenches T1, which pass through the first stacked structure ST1 and extend in the first direction I, may be formed. Accordingly, the first stacked structure ST1 may be patterned into line patterns, which extend in parallel with each other in the first direction I. In addition, the row line conductive layer 30 may be patterned to form row lines, which extend in the first direction I. Hereinafter, the row lines are denoted by the reference numeral "30."

Subsequently, first liner layers 36 may be formed on inner walls of the first trenches T1. The first liner layers 36 may prevent damage to layers included in the first stacked structure ST1 during subsequent fabricating processes. The first liner layers 36 may cover sidewalls of one or more of the row lines 30, the lower electrode layer 31, the switching material layer 32, the intermediate electrode layer 33, the variable resistance material layer 34, and the upper electrode layer 35. In another embodiment, the first liner layers 36 may cover the sidewalls of the lower electrode layer 31, the switching material layer 32, the intermediate electrode layer 33, the variable resistance material layer 34, and the upper electrode layer 35, and may expose the sidewalls of the row line 30.

Each of the first liner layers 36 may include a single layer or multiple layers. For example, after the first trenches T1 are formed, the first liner layers 36 may be formed along inner surfaces of the first trenches T1, and each of the first liner layers 36 may be a single layer. In another embodiment, after preliminary first trenches T1 are formed by partially etching the first stacked structure ST1, initial layers of the first liner layers 36 may be formed, and after the preliminary first trenches T1 are extended downwards, one or more additional layers of the first liner layers 36 may be further formed on the initial layers. In this embodiment, a process of extending the first trenches T1 downwards and further forming the one or more additional layers of the first liner layers 36 may be repeated multiple times. In this embodiment, the initial layers of the first liner layers 36 may prevent layers that are already patterned from being damaged when the first trenches T1 are extended downwards. In various embodiments, each of the first liner layers 36 may include multiple layers, and an upper portion of each of the first liner layers 36 may have a greater thickness than a lower portion of each of the first liner layers 36.

The first liner layers 36 may include a nonconductive material, such as a nitride, polysilicon, or both. For example, the first liner layers 36 may include a silicon nitride (SiNx), polysilicon, a titanium nitride (TiN), a tantalum nitride (TaN), or a combination thereof.

Subsequently, sacrificial patterns 37 may be formed in the first trenches T1. The sacrificial patterns 37 may include a material having high etch selectivity to the first liner layers 36. For example, the sacrificial patterns 37 may include an oxide, a silicon oxide ($SiO_x$), a Spin On Coating (SOC) material, or a combination thereof.

Figure 3B:
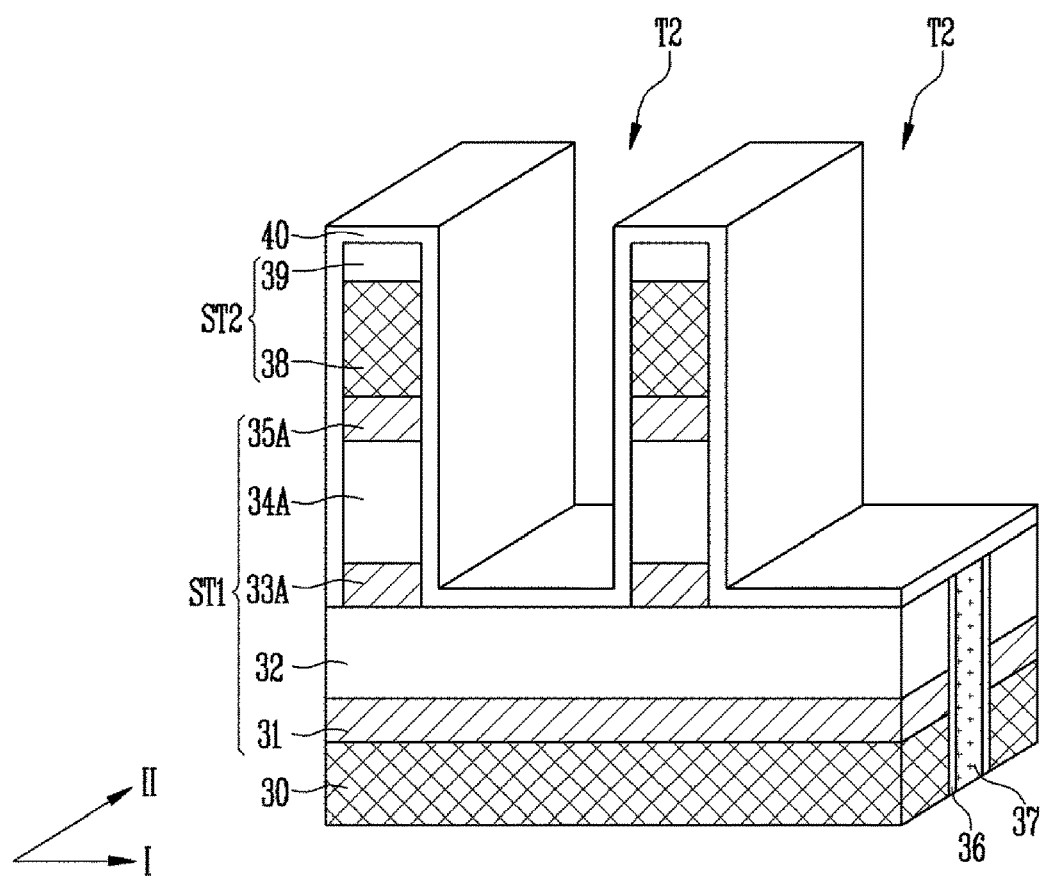

Referring to FIG. 3B, a second stacked structure ST2 may be formed over the first stacked structure ST1, the first liner layers 36, and the sacrificial patterns 37. For example, a column line conductive layer and a hard mask layer may be sequentially formed. Subsequently, second trenches T2, which extend in a second direction II intersecting the first direction I, may be formed. The second trenches T2 may pass through the first stacked structure ST1 and the second stacked structure ST2, or may pass through a portion of the first stacked structure ST1 and the second stacked structure ST2. In another embodiment, the second trenches T2 may pass through the second stacked structure ST2 without passing through the first stacked structure ST1 or may pass through the second stacked structure ST2 and a portion of the first stacked structure ST1.

As shown in FIG. 3B, the second trenches T2 may be formed by etching the hard mask layer, the column line conductive layer, the upper electrode layer 35, the variable resistance material layer 34, and the intermediate electrode layer 33. Accordingly, hard mask patterns 39 and column lines 38, which have linear shapes extending in parallel with each other in the second direction II, may be formed. In addition, upper electrodes 35A, variable resistance materials 34A, and intermediate electrodes 33A, which have isolated island shapes that are separated from each other in the first direction I and the second direction II, may be formed.

Subsequently, a second liner layer 40 may be formed on inner walls of the second trenches T2. The second liner layer may be formed along surfaces of the patterned second stacked structures ST2, and may be formed on surfaces of the first stacked structures ST1 that are exposed by the second trenches T2.

The second liner layer 40 may include a nonconductive material, such as a nitride, polysilicon, or a combination thereof. For example, the second liner layers 40 may include a silicon nitride ($SiN_x$), polysilicon, titanium nitride (TiN), a tantalum nitride (TaN), or a combination thereof. The second liner layers 40 may include the same material as the first liner layers 36.

Figure 3C:
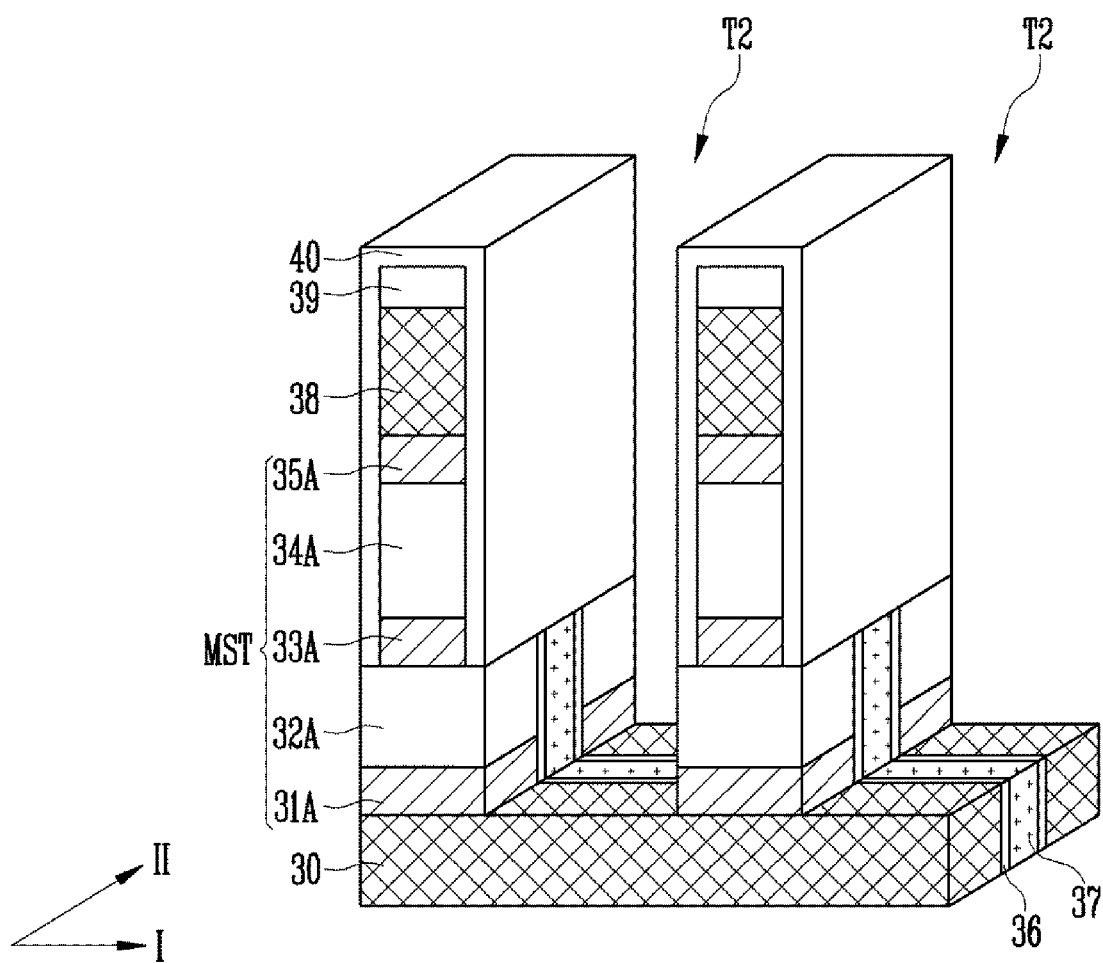

Referring to FIG. 3C, memory stacks MST, which are spaced apart in the first direction I and the second direction II, may be formed by extending the second trenches T2 downwards. For example, the second trenches T2 may be extended downwards by etching the switching material layer 32 and the lower electrode layer 31. Regions of the second liner layer 40 that are disposed on lower surfaces of the second trenches T2 may be removed, so that the second liner layer 40 may be separated in the first direction I into a plurality of patterns. In addition, the switching material layer 32 and the lower electrode layer 31 may be etched, so that a plurality of structures each including a lower electrode 31A and a switching material 32A may be formed. The plurality of structures may have island shapes, and may be separated from each other in the first direction I and the second direction II. Accordingly, the memory stacks MST in which the lower electrode 31A, the switching material 32A, the intermediate electrode 33A, the variable resistance material 34A, and the upper electrode 35A are sequentially stacked on each other may be formed.

Sidewalls of respective memory stacks MST facing each other in the second direction II may be covered by the first liner layers 36, and sidewalls of respective memory stacks MST facing each other in the first direction I may be covered by the second liner layer 40. In addition, the second liner layer 40 may have a linear shape extending in the second direction II, and thus continuously cover sidewalls of each pair of memory stacks MST that neighbor each other in the second direction II.

The second liner layer 40 may cover sidewalls of the intermediate electrode 33A, the variable resistance material 34A, and the upper electrode 35A, and may expose sidewalls of the lower electrode 31A and the switching material 32A. The intermediate electrode 33A, the variable resistance material 34A, and the upper electrode 35A may have smaller widths than the lower electrode 31A and the switching material 32A in the first direction I, such that sidewalls of the second liner layer 40 may be aligned with sidewalls of the lower electrode 31A and the switching material 32A. In addition, the sacrificial patterns 37, which fill spaces between the memory stacks MST neighboring each other in the second direction II, may be exposed by the second trenches T2 that has been extended downwards by etching the switching material layer 32 and the lower electrode layer 31.

Figure 3D:
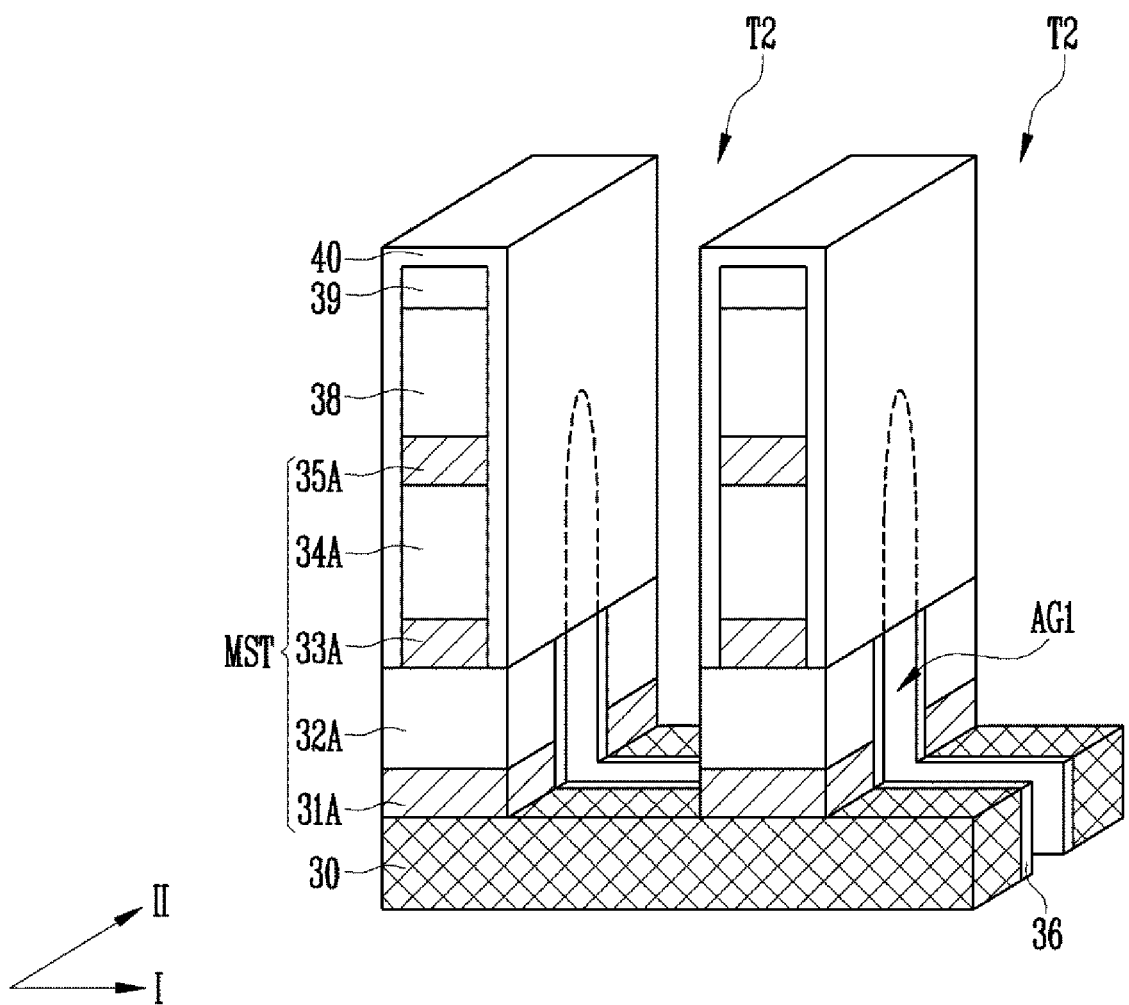

Referring to FIG. 3D, the first air gaps AG1 may be formed by removing the remaining sacrificial patterns 37 through the second trenches T2. Portions of the sacrificial patterns 37 filling spaces between the row lines 30 neighboring in the second direction II may be removed, and portions of the sacrificial patterns 37 covered by the second liner layers 40 may also be removed. Accordingly, the first air gaps AG1 may be formed in spaces covered by the second liner layers 40, and may have isolated shapes in the second liner layers 40.

When the sacrificial patterns 37 are removed, the first and second liner layers 36 and 40 may prevent damage to the layers that are already formed. For example, the first liner layers 36 may protect the sidewalls of the memory stacks MST that face each other in the second direction II, and the second liner layers 40 may protect the sidewalls of the memory stacks MST that face each other in the first direction I. In addition, since the second liner layers 40 cover a portion of the sidewalls of the memory stacks MST, for example, upper portions of the sidewalls, a passage through which an etchant or an etch gas flows may be provided to a portion covered by the second liner layers 40.

The sacrificial patterns 37 may be selectively etched by using the etchant or the etch gas. The etchant includes, for example, a buffer oxide etchant (BOE), diluted hydrofluoric acid (DHF), a fluorine-based etch gas, or a combination thereof. The etch gas includes, for example, $NF_3$ gas, $NH_3$ gas, $CF_4$ gas, or a combination thereof.

The etchant or the etch gas flows in between the lower electrode 31A and the switching material 32A, which are exposed by the second liner layers 40, so that the sacrificial patterns 37 may be selectively etched. Accordingly, the first air gaps AG1 may be formed in a space defined by the second liner layers 40. The sacrificial patterns 37 may be completely removed, or portions of the sacrificial patterns 37 may remain in the space defined by the second liner layers 40.

Figure 3E:
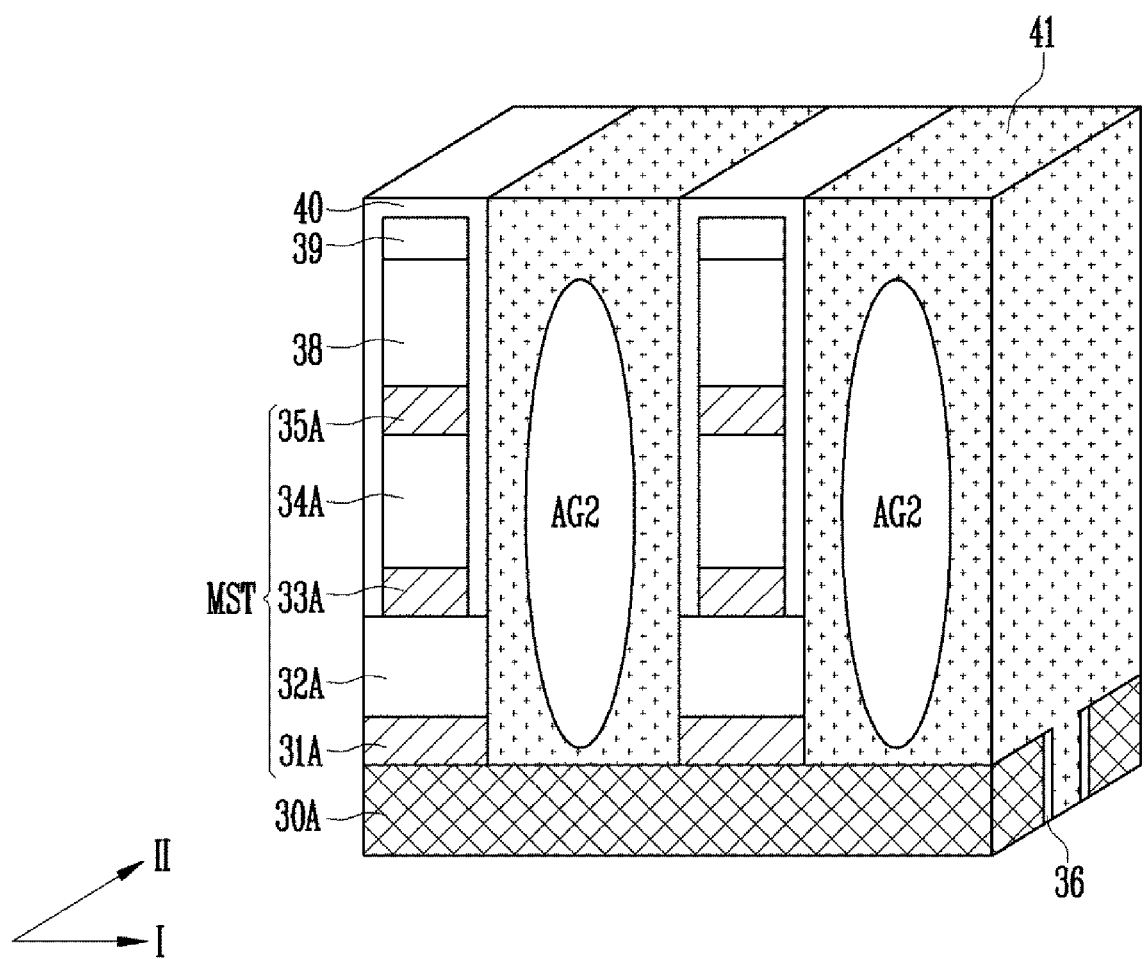

Referring to FIG. 3E, insulating patterns 41 may be formed in the second trenches T2. For example, after insulating materials are formed to fill the second trenches T2, a planarization process may be performed until surfaces of the second liner layers 40, surfaces of the hard mask patterns 39, or both, are exposed. Accordingly, the insulating patterns 41 may have linear shapes that extend in parallel with each other in the second direction II. The insulating patterns 41 may be formed by using a deposition method with poor step coverage, and accordingly, the second air gaps AG2 may be formed inside the insulating patterns 41, respectively. Each of the second air gaps AG2 may be located between a pair of the memory stacks MST neighboring each other in the first direction I, and may have a linear shape extending in the second direction II.

The insulating patterns 41 and the sacrificial patterns 37 may include the same materials. The insulating patterns 41 may include a material having high etch selectivity to the first and second liner layers 36 and 40. For example, the insulating patterns 41 may include an oxide, such as a silicon oxide ($SiO_x$), a Spin On Coating (SOC) material, or a combination thereof.

According to the above-described fabricating method, the air gaps AG1 and AG2 may be formed after the first and second trenches T1 and T2 are formed. According to an embodiment, it may be possible to prevent damage to the memory stacks MST when the sacrificial patterns 37 are removed, by forming the first and second liner layers 36 and 40 on the sidewalls of the memory stacks MST. In addition, as the second liner layers 40 cover a portion of the sidewall of each of the memory stacks MST, the sacrificial patterns 37 that fill spaces between the memory stacks MST may be exposed by the second liner layers 40. The exposed sacrificial patterns 37 may be removed using the etchant or the etch gas. In addition, the etchant or the etch gas may flow into the second liner layers 40. Thus, the sacrificial patterns 37 within the second liner layers 40 may be etched and a space defined by the second liner layers 40 may be formed. Accordingly, the first air gaps AG1 may be easily formed in the space defined by the second liner layers 40.

Figure 4:
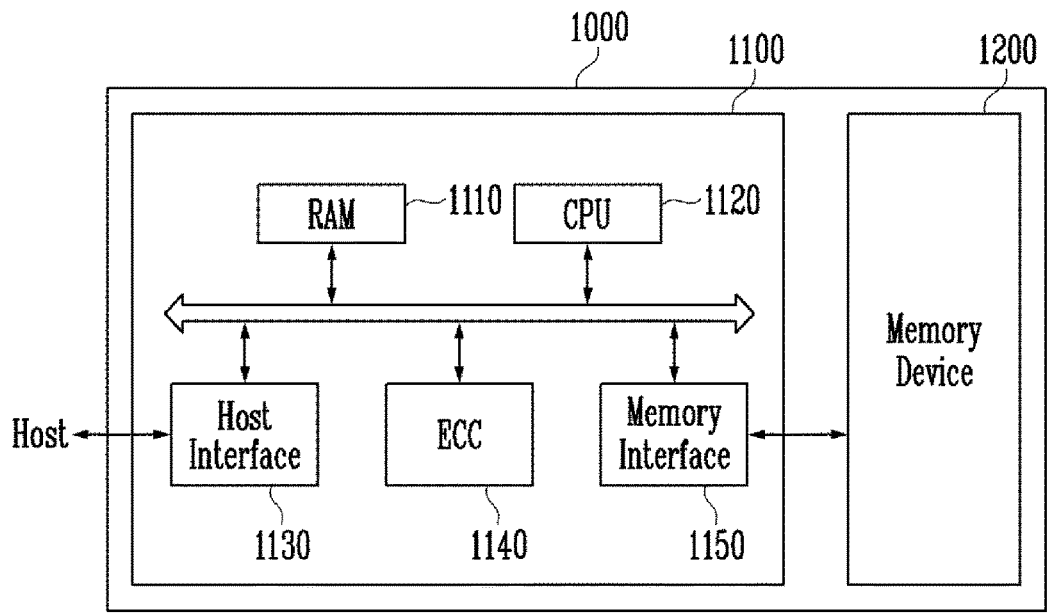
FIGS. 4 and 5 are block diagrams illustrating configurations of memory systems according to embodiments of the present disclosure.

FIG. 4 is a block diagram illustrating a configuration of a memory system 1000 according to an embodiment of the present disclosure.

Referring to FIG. 4, the memory system 1000 according to the embodiment of the present disclosure may include a memory device 1200 and a controller 1100.

The memory device 1200 may be used to store data information having various data formats such as a text format, a graphical format, and a software code format. The memory device 1200 may be a non-volatile memory. In addition, the memory device 1200 may have structures described with reference to FIGS. 1A to 3E, and may be manufactured according to the fabricating method described with reference to FIGS. 1A to 3E. According to an embodiment, the memory device 1200 may include a plurality of memory stacks arranged in a first direction and a second direction intersecting the first direction, first liner layers covering sidewalls of the memory stacks that neighbor each other in the second direction and extending in the second direction, first air gaps located in the first liner layers, and second air gaps located between the memory stacks neighboring each other in the first direction and that extend in the second direction. Since the structure and the fabricating method of the memory device 1200 are the same as described above, a detailed description thereof will be omitted.

The controller 1100 may be coupled to a host and the memory device 1200, and may be configured to access the memory device 1200 in response to a request from the host. For example, the controller 1100 may control read, write, erase and background operations of the memory device 1200.

The controller 1100 may include a Random Access Memory (RAM) 1110, a Central Processing Unit (CPU) 1120, a host interface 1130, an Error Correction Code (ECC) circuit 1140, and a memory interface 1150.

The RAM 1110 may serve as an operation memory of the CPU 1120, a cache memory between the memory device 1200 and the host, and a buffer memory between the memory device 1200 and the host. The RAM 1110 may be replaced by a Static Random Access Memory (SRAM) or a Read Only Memory (ROM).

The CPU 1120 may be configured to control overall operations of the controller 1100. For example, the CPU 1120 may be configured to operate firmware, such as a Flash Translation Layer (FTL), stored in the RAM 1110.

The host interface 1130 may be configured to interface with the host. For example, the controller 1100 may communicate with the host through at least one of various interface protocols among a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The ECC circuit 1140 may be configured to detect and correct errors included in data that is read from the memory device 1200 by using an error correction code (ECC).

The memory interface 1150 may be configured to interface with the memory device 1200. For example, the memory interface 1150 may include a NAND interface or a NOR interface.

The controller 1100 may further include a buffer memory (not illustrated) to temporarily store data. The buffer memory may be used to temporarily store data that is externally transferred through the host interface 1130 or data that is transferred from the memory device 1200 through the memory interface 1150. In addition, the controller 1100 may further include a ROM storing code data for interfacing with the host.

Since the memory system 1000 according to the embodiment of the present disclosure includes the memory device 1200 having increased integration density and improved characteristics, integration density and characteristics of the memory system 1000 may also be improved.

Figure 5:
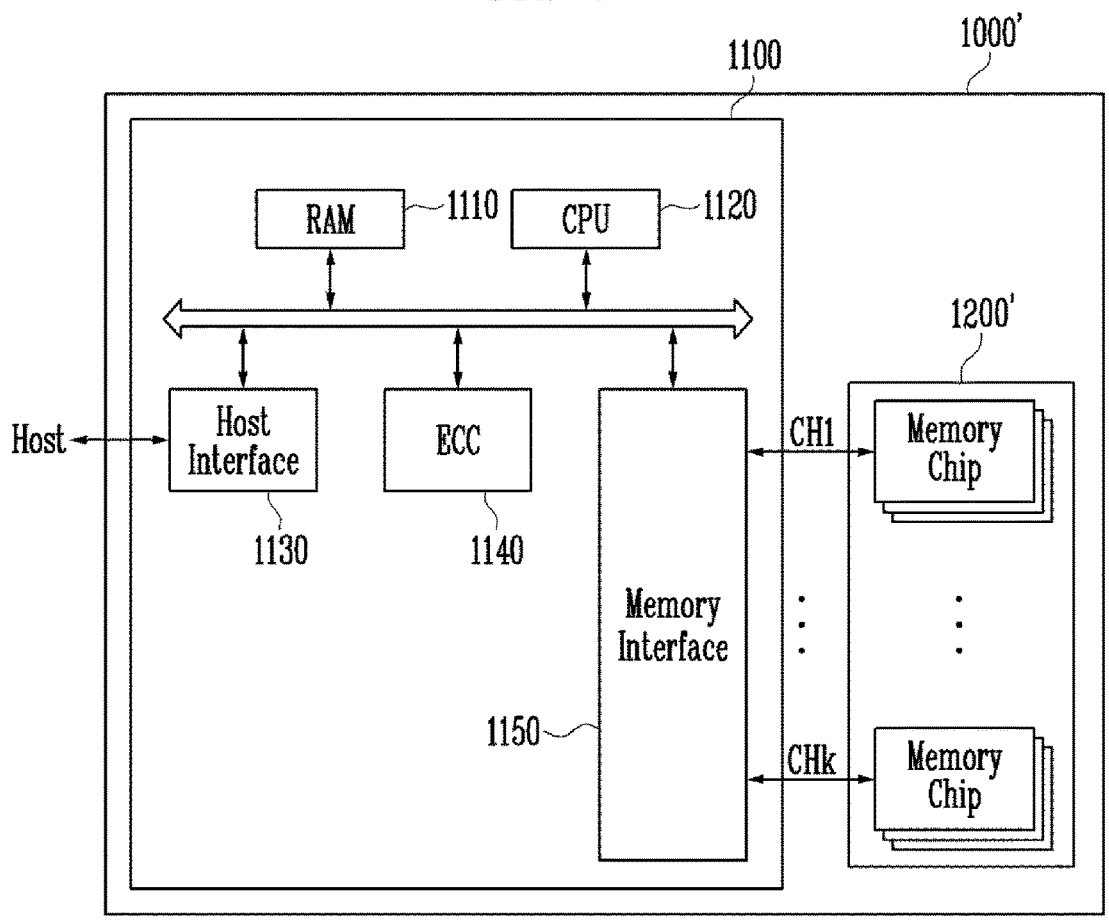

FIG. 5 is a block diagram illustrating a configuration of a memory system 1000' according to an embodiment of the present disclosure.

Referring to FIG. 5, the memory system 1000' according to the embodiment of the present disclosure may include a memory device 1200' and the controller 1100. The controller 1100 may include a RAM 1110, a CPU 1120, a host interface 1130, an ECC circuit 1140, and a memory interface 1150.

The memory device 1200' may be a non-volatile memory. In addition, the memory device 1200' may have the structure described above with reference to FIGS. 1A to 3E, and may be manufactured according to the fabricating method described above with reference to FIGS. 1A to 3E. According to an embodiment, the memory device 1200' may include a plurality of memory stacks arranged in a first direction and a second direction intersecting the first direction, first liner layers covering sidewalls of the memory stacks that neighbor each other in the second direction and extending in the second direction, first air gaps located in the first liner layers, and second air gaps located between the memory stacks neighboring each other in the first direction and that extend in the second direction. Since the structure and the fabricating method of the memory device 1200' are the same as described above, a detailed description thereof will be omitted.

The memory device 1200' may be a multi-chip package composed of a plurality of memory chips. The plurality of memory chips may be divided into a plurality of groups, and the plurality of groups may be configured to communicate with the controller 1100 through first to kth channels CH1 to CHk. In addition, memory chips included in a single group may be configured to communicate with the controller 1100 through a common channel. The memory system 1000' may be changed so that a single memory chip may be coupled to a single channel.

Since the memory system 1000' according to the embodiment of the present disclosure includes the memory device 1200' having increased integration density and improved characteristics, integration density and characteristics of the memory system 1000' may also be improved. More specifically, the memory device 1200' may be configured as the multi-chip package, so that data storage capacity and driving speed of the memory system 1000' may be increased.

Figure 6:
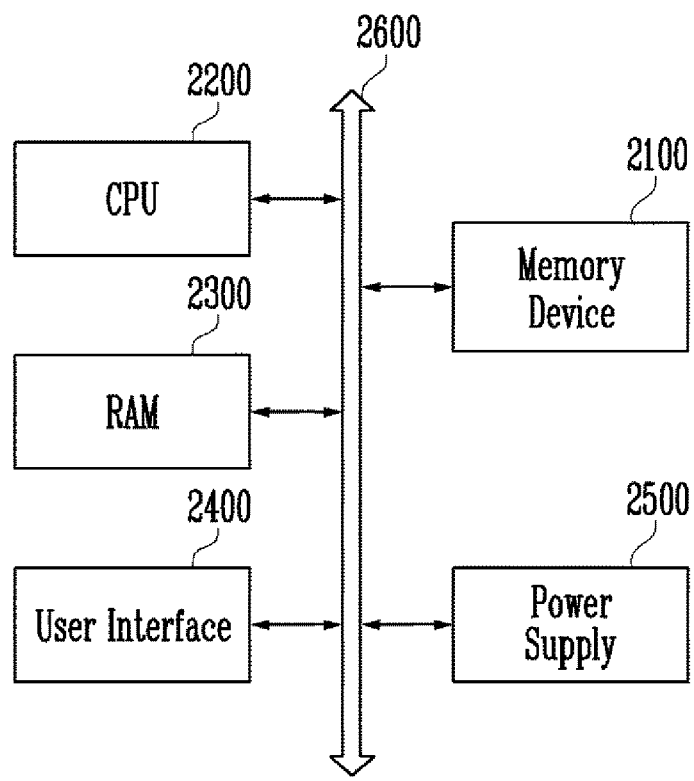
FIGS. 6 and 7 are block diagrams illustrating configurations of computing systems according to embodiments of the present disclosure.

FIG. 6 is a block diagram illustrating a configuration of a computing system 2000 according to an embodiment of the present disclosure. Hereinafter, any repetitive detailed description of components already mentioned above will be omitted.

Referring to FIG. 6, the computing system 2000 according to the embodiment of the present disclosure may include a memory device 2100, a CPU 2200, a RAM 2300, a user interface 2400, a power supply 2500, and a system bus 2600.

The memory device 2100 may store data provided through the user interface 2400 and data processed by the CPU 2200. In addition, the memory device 2100 may be electrically connected to the CPU 2200, the RAM 2300, the user interface 2400 and the power supply 2500 through the system bus 2600. For example, the memory device 2100 may be connected to the system bus 2600 through a controller (not illustrated) or may be directly connected to the system bus 2600. When the memory device 2100 is directly connected to the system bus 2600, the CPU and the RAM 2300 may function as the controller.

The memory device 2100 may be a non-volatile memory. In addition, the memory device 2100 may have the structure described above with reference to FIGS. 1A to 3E, and may be manufactured according to the fabricating method described above with reference to FIGS. 1A to 3E. According to an embodiment, the memory device 2100 may include a plurality of memory stacks being arranged in a first direction and a second direction that intersects the first direction, first liner layers covering sidewalls of the memory stacks that neighbor each other in the second direction and extending in the second direction, first air gaps being located in the first liner layers, and second air gaps being located between the memory stacks that neighbor each other in the first direction and extending in the second direction. Since the structure and the fabricating method of the memory device 2100 are the same as described above, a detailed description thereof will be omitted.

In addition, the memory device 2100 may be a multi-chip package composed of a plurality of memory chips as described with reference to FIG. 5.

The computing system 2000 having the above-described configuration may be a computer, an Ultra Mobile PC (UMPC), a workstation, a net-book, Personal Digital Assistants (PDA), a portable computer, a web tablet, a wireless phone, a mobile phone, a smart phone, an e-book, a Portable Multimedia Player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, one of various electronic devices forming a home network, one of various electronic devices forming a computer network, one of various electronic devices forming a telematics network, an RFID device, or a combination thereof.

Since the computing system 2000 according to the embodiment of the present disclosure includes the memory device 2100 having increased integration density and improved characteristics, characteristics of the computing system 2000 may also be improved.

Figure 7:
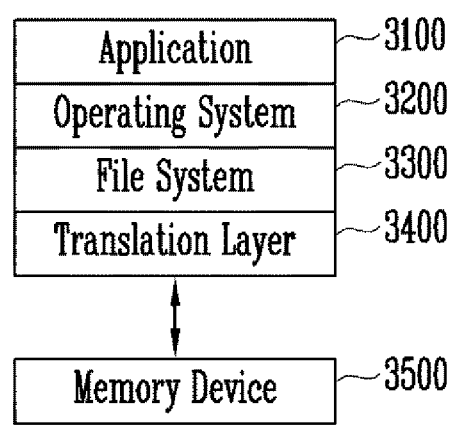

FIG. 7 is a block diagram illustrating a configuration of a computing system 3000 according to an embodiment of the present disclosure.

Referring to FIG. 7, the computing system 3000 according to the embodiment of the present disclosure may include a software layer which includes an operating system 3200, an application 3100, a file system 3300, a translation layer 3400, etc. In addition, the computing system 3000 may include a hardware layer such as a memory device 3500.

The operating system 3200 may manage software and hardware resources of the computing system 3000 and may control program execution of a central processing unit. The application 3100 may refer to various application programs executed in the computing system 3000 and may be a utility executed by the operating system 3200.

The file system 3300 may refer to a logical structure configured to manage data and files present in the computing system 3000, and to organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT) or an NT file system (NTFS). In addition, when the operating system 3200 is a Unix/Linux-based system, the file system 3300 may be an extended file system (EXT), a Unix File System (UFS), or a Journaling File System (JFS).

FIG. 7 illustrates the operating system 3200, the application 3100, and the file system 3300 in separate blocks. However, the application 3100 and the file system 3300 may be included in the operating system 3200.

The translation layer 3400 may translate an address into a format appropriate for the memory device 3500 in response to a request from the file system 3300. For example, the translation layer 3400 may translate a logic address generated by the file system 3300 into a physical address of the memory device 3500. Mapping information of the logic address and the physical address may be stored in an address translation table. For example, the translation layer 3400 may be a Flash Translation Layer (FTL) or a Universal Flash Storage Link Layer (ULL).

The memory device 3500 may be a non-volatile memory. In addition, the memory device 3500 may have a structure consistent with embodiments described above with reference to FIGS. 1A to 3E, and may be manufactured according to a fabricating method consistent with embodiments described above with reference to FIGS. 1A to 3E. According to an embodiment, the memory device 3500 may include memory stacks being arranged in a first direction and a second direction that intersects the first direction, first liner layers covering sidewalls of the memory stacks that neighbor each other in the second direction and extending in the second direction, first air gaps being located in the first liner layers, and second air gaps being located between the memory stacks that neighbor each other in the first direction and extending in the second direction. Since the structure and the fabricating method of the memory device 3500 are the same as various embodiments described above, a detailed description thereof will be omitted.

The computing system 3000 having the above-described configuration may be divided into an operating system layer operated in an upper level region and a controller layer operated in a lower level region. The application 3100, the operating system 3200, and the file system 3300 may be included in the operating system layer and may be driven by an operation memory of the computer system 3000. In addition, the translation layer 3400 may be included in the operating system layer or the controller layer.

Since the computing system 3000 according to the embodiment of the present disclosure includes the memory device 3500 having increased integration density and improved characteristics, characteristics of the computing system 3000 may also be improved.

An electronic device and a method for fabricating the same according to various embodiments of the present disclosure may include a plurality of memory cells with improved operation characteristics and reliability. More specifically, an air gap may be formed between each pair of neighboring memory cells, so that characteristics of the memory cells may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the effective filing date of the present patent document, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in forms and details may be made without departing from the spirit and scope of the present disclosure as set forth in the following claims.

What is claimed is:

1. A method of fabricating an electronic device including a semiconductor memory, the method comprising:
    forming a stacked structure;
    forming a plurality of first trenches that pass through the stacked structure and that extend in a first direction;
    forming a plurality of first liner layers on inner walls of the first trenches;
    forming a plurality of sacrificial patterns in the first trenches;
    forming a plurality of second trenches that partially pass through the stacked structure and that extend in a second direction intersecting the first direction;
    forming a plurality of second liner layers on inner walls of the second trenches;
    forming memory stacks neighboring each other in the first direction and the second direction by extending the second trenches downwards after the second liner layers are formed; and
    forming first air gaps in the second liner layers by removing the sacrificial patterns through the second trenches.

2. The method of claim 1, wherein the first air gaps are located in spaces covered by the second liner layers between each pair of the memory stacks that neighbor each other in the second direction, each of the first air gaps having an isolated shape.

3. The method of claim 1, further comprising forming second air gaps in the second trenches after forming the first air gaps.

4. The method of claim 3, wherein the second air gaps are located between each pair of the memory stacks that neighbor each other in the first direction, each of the second air gaps having a linear shape that extends in the second direction.

5. The method of claim 1, wherein forming the stacked structure comprises:
    forming a lower electrode layer;
    forming a switching material layer on the lower electrode layer;
    forming an intermediate electrode layer on the switching material layer;
    forming a variable resistance material layer on the intermediate electrode layer; and
    forming an upper electrode layer on the variable resistance material layer.

6. The method of claim 5, wherein forming the plurality of second trenches comprises etching the upper electrode layer, the variable resistance material layer, and the intermediate electrode layer.

7. The method of claim 6, wherein forming the memory stacks comprises etching the switching material layer and the lower electrode layer.

8. The method of claim 1, further comprising:
forming a column line conductive layer on the stacked structure before forming the second trenches.

9. The method of claim 8, wherein the stacked structure comprises a row line conductive layer, a lower electrode layer, a switching material layer, an intermediate electrode layer, a variable resistance material layer, and an upper electrode layer, and
wherein forming the second trenches comprises etching the column line conductive layer, the upper electrode layer, the variable resistance material layer, and the intermediate electrode layer.

10. The method of claim 9, wherein forming the memory stacks comprises etching the switching material layer and the lower electrode layer.

11. The method of claim 1, wherein forming the first air gaps comprises selectively etching the sacrificial patterns by using a buffer oxide etchant (BOE), diluted hydrofluoric acid (DHF), or both.

12. The method of claim 1, wherein forming the first air gaps comprises selectively etching the sacrificial patterns by using $NF_3$ gas, $NH_3$ gas, $CF_4$ gas, or a combination thereof.

13. The method of claim 1, further comprising:
forming insulating patterns in the second trenches after the first air gaps are formed.

14. The method of claim 13, wherein the insulating patterns include second air gaps, respectively.

15. A method of fabricating an electronic device, the method comprising:
forming a stacked structure;
forming first trenches that pass through the stacked structure;
forming sacrificial patterns in the first trenches;
forming second trenches that partially pass through the stacked structure and intersect the first trenches;
forming liner layers on inner walls of the second trenches;
etching the stacked structure using the liner layers as an etch barrier; and
forming first air gaps in the liner layers by removing the sacrificial patterns through the second trenches.

16. The method of claim 15, further comprising:
forming insulating patterns in the second trenches after the first air gaps are formed.

17. The method of claim 16, wherein the insulating patterns include second air gaps, respectively.

18. The method of claim 15, wherein the stacked structure includes a lower electrode layer, a switching material layer, an intermediate electrode layer, a variable resistance material layer, and an upper electrode layer.

* * * * *